United States Patent
Yu et al.

(10) Patent No.: US 9,171,719 B2
(45) Date of Patent: Oct. 27, 2015

(54) METHOD OF DEFINING POLY-SILICON GROWTH DIRECTION

(71) Applicant: Shenzhen China Star Optoelectronics Technology Co., Ltd., Shenzhen, Guangdong (CN)

(72) Inventors: Wei Yu, Shenzhen (CN); Kuancheng Lee, Shenzhen (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 12 days.

(21) Appl. No.: 14/348,887

(22) PCT Filed: Jan. 23, 2014

(86) PCT No.: PCT/CN2014/071291
§ 371 (c)(1),
(2) Date: Mar. 31, 2014

(87) PCT Pub. No.: WO2015/100827
PCT Pub. Date: Jul. 9, 2015

(65) Prior Publication Data
US 2015/0187576 A1    Jul. 2, 2015

(30) Foreign Application Priority Data

Dec. 30, 2013 (CN) .......................... 2013 1 0746243

(51) Int. Cl.
*H01L 21/322* (2006.01)
*H01L 21/02* (2006.01)

(52) U.S. Cl.
CPC ...... *H01L 21/02675* (2013.01); *H01L 21/0217* (2013.01); *H01L 21/0262* (2013.01);

(Continued)

(58) Field of Classification Search
CPC ... H01L 21/308; H01L 21/467; H01L 21/475; H01L 21/02332; H01L 21/28194; H01L 21/0228; H01L 21/28079; H01L 21/02126; H01L 21/02672; H01L 23/53271; H01L 27/0922; H01L 29/1606; H01L 29/1602; H01L 29/1604; H01L 29/2438; H01L 29/1608; B23K 26/18; B23K 26/043
USPC ......... 438/475, 680, 463, 482, 487, 657, 942, 438/199, 97, 98, 308, 311, 357, 361, 365, 438/448, 459, 486, 535, 723, 724; 257/E21.006, E21.007, E21.023, 257/E21.077, E21.084, E21.091, E21.126, 257/E21.127, E21.17, E21.225, E21.227, 257/E21.231, E21.267, E21.278, E21.293, 257/E21.314, E21.32, E21.327, E21.347
See application file for complete search history.

(56) References Cited

U.S. PATENT DOCUMENTS

| | | | |
|---|---|---|---|
| 7,521,292 B2 * | 4/2009 | Rogers et al. | 438/118 |
| 7,982,296 B2 * | 7/2011 | Nuzzo et al. | 257/679 |
| 8,372,726 B2 * | 2/2013 | de Graff et al. | 438/457 |

(Continued)

FOREIGN PATENT DOCUMENTS

| | | |
|---|---|---|
| CN | 102856173 A | 1/2013 |
| CN | 103124691 A | 5/2013 |
| WO | WO2013165620 A1 | 11/2013 |

*Primary Examiner* — David Nhu
(74) *Attorney, Agent, or Firm* — Andrew C. Cheng

(57) ABSTRACT

A method of defining poly-silicon growth direction includes Step 1, forming a buffer layer on a substrate; Step 2, forming a regular graphene array; Step 3, forming an amorphous silicon thin film on the buffer layer, which the regular graphene array has formed thereon; and Step 4, transferring the amorphous silicon thin film into poly-silicon with an excimer laser anneal process. The growth direction of the poly-silicon as being formed can be controlled according to the present method of defining poly-silicon growth direction. Accordingly, the grain size of the poly-silicon can be raised.

15 Claims, 2 Drawing Sheets

(52) U.S. Cl.
CPC .... *H01L21/02164* (2013.01); *H01L 21/02266* (2013.01); *H01L 21/02271* (2013.01); *H01L 21/02422* (2013.01); *H01L 21/02444* (2013.01); *H01L 21/02532* (2013.01); *H01L 21/02592* (2013.01)

(56) References Cited

U.S. PATENT DOCUMENTS 8,552,299 B2 * 10/2013 Rogers et al. ............... 174/254
8,946,683 B2 * 2/2015 Rogers et al. ................ 257/9

* cited by examiner

METHOD OF DEFINING POLY-SILICON GROWTH DIRECTION

This application is a 371 of PCT/CN2014/071291 filed Jan. 23, 2014; China 20121076243.5 filed Dec. 30, 2013.

BACKGROUND OF THE INVENTION

1. Field of the Invention

The present invention relates to the technical field of liquid crystal displaying, and in particular to a method of defining poly-silicon growth direction.

2. Description of Prior Art

With the development of the flat panel displays, the panels with higher resolution and lower power consumption are constantly required. Unlike amorphous silicon, of which the electron mobility is low, the low temperature poly-silicon can be produced in a low temperature environment. With the high electron mobility and capability of manufacturing the C-MOS (Complementary Metal Oxide Semiconductor) circuit, the low temperature poly-silicon is widely discussed for meeting the requirement of high resolution and low power consumption.

The low temperature poly-silicon (LTPS) is a branch of poly-silicon technology. For the flat panel displays, the application of the poly-silicon liquid crystal material provides lots of merits. For example, the film circuit can be thinner, smaller and having lower power consumption.

In the initial developing stages of the poly-silicon technology, a laser anneal process, which is a high temperature oxidation process is necessary for transferring the structure of the glass substrate from amorphous silicon (a-Si) into poly-silicon. In this moment, the temperature of the glass substrate can reach over 1000 degree C. In comparison with the traditional high temperature poly-silicon, the laser exposure process is still required for the low temperature poly-silicon, thought. Nevertheless, an excimer laser is employed as being the heat source. After the laser is conducted through the transmission system, a laser beam with uniformly distributed energy is projected on the glass substrate with amorphous silicon structure. After the glass substrate with amorphous silicon structure absorbs the energy of the excimer laser, the glass substrate is then transferred into poly-silicon structure substrate. The whole process is accomplished under 500-600 degree C. Even a normal glass substrate can bare such a temperature which enormously reduces the manufacture cost. Beside reduction of the manufacture cost, the low temperature poly-silicon technology further provides more merits: higher electron mobility; smaller film circuit area; higher resolution; simple structure and greater stability.

At present, several methods for producing the low temperature poly-silicon can be illustrated, such as solid phase crystallization (SPC), solid phase crystallization (SPC) and excimer laser anneal (ELA), among which excimer laser anneal (ELA) is the most widely used method nowadays.

The manufacture method of low temperature poly-silicon by excimer laser anneal is to grow a buffer layer on a glass. Then, amorphous silicon is grown thereon. After the high temperature dehydrogenation process and the HF precleaning process, the laser of the ELA scans the amorphous silicon. The amorphous silicon melts at very high temperature and re-crystallized into poly-silicon.

The grain size of the low temperature poly-silicon possesses quite significant effect to the electricity of the poly-silicon. During the ELA process, the amorphous silicon suffered with the high temperature and nearly completely melts. Then, the re-crystallizion into poly-silicon of the amorphous silicon accomplished. As being re-crystallized, the occurrence of crystallization follows the direction from low energy toward high energy, i.e. crystallization occurs from the low temperature area toward the high temperature area; the start point and the direction of crystallization are in a mess. Consequently, the grain size is too small and too many grain boundaries appear. Accordingly, electron mobility of the poly-silicon can be significantly affected.

SUMMARY OF THE INVENTION

Thus, an objective of the present invention is to provide a method of defining poly-silicon growth direction to control the growth direction of the poly-silicon as being formed.

To achieve the objective, the present invention provides a method of defining poly-silicon growth direction, comprising:

Step 1, forming a buffer layer on a substrate;

Step 2, forming a regular graphene array on the buffer layer;

Step 3, forming an amorphous silicon thin film on the buffer layer, which the regular graphene array has formed thereon; and Step 4, transferring the amorphous silicon thin film into poly-silicon with an excimer laser anneal process.

Step 2 further comprises:

Step 2.1, forming a patterned masklayer on the buffer layer according the graphene array;

Step 2.2, forming the graphene array by a chemical vapor deposition process; and Step 2.3, removing the masklayer.

The amorphous silicon thin film is treated by a high temperature dehydrogenation process before the excimer laser anneal process in Step 4 is performed.

A material of the buffer layer is silicon nitride or silicon dioxide.

The substrate is glass.

The distribution of the graphene array on the surface of the buffer layer is preset according to poly-silicon growth direction to be defined in Step 4.

The buffer layer and the amorphous silicon thin film are respectively formed by a chemical vapor deposition process.

An insulation layer is further formed between the substrate and the buffer layer.

A material of the insulation layer is aluminum nitride, boron nitride, aluminum oxide or magnesium oxide.

The insulation layer is formed by a magnetron sputtering process or a chemical vapor deposition process.

The present invention also provides a method of defining poly-silicon growth direction, comprising:

Step 1, forming a buffer layer on a substrate;

Step 2, forming a regular graphene array on the buffer layer;

Step 3, forming an amorphous silicon thin film on the buffer layer, which the regular graphene array has formed thereon; and Step 4, transferring the amorphous silicon thin film into poly-silicon with an excimer laser anneal process, wherein Step 2 further comprises:

Step 2.1, forming a patterned masklayer on the buffer layer according the graphene array;

Step 2.2, forming the graphene array by a chemical vapor deposition process; and Step 2.3, removing the masklayer; and wherein before the excimer laser anneal process in Step 4 is performed, amorphous silicon thin film is treated by a high temperature dehydrogenation process, and a material of the buffer layer is silicon nitride or silicon dioxide, and the substrate is glass, and wherein distribution of the graphene array on the surface of the buffer layer is preset according to poly-silicon growth direction to be defined in Step 4.

The buffer layer and the amorphous silicon thin film are respectively formed by a chemical vapor deposition process.

An insulation layer is further formed between the substrate and the buffer layer.

A material of the insulation layer is aluminum nitride, boron nitride, aluminum oxide or magnesium oxide.

The insulation layer is formed by a magnetron sputtering process or a chemical vapor deposition process.

The growth direction of the poly-silicon as being formed can be controlled according to the present method of defining poly-silicon growth direction. Accordingly, the grain size of the poly-silicon can be raised.

BRIEF DESCRIPTION OF THE DRAWINGS

The technical solution, as well as beneficial advantages, of the present invention will be apparent from the following detailed description of an embodiment of the present invention, with reference to the attached drawings. In the drawings.

DETAILED DESCRIPTION OF THE PREFERRED EMBODIMENTS

Figure 1:
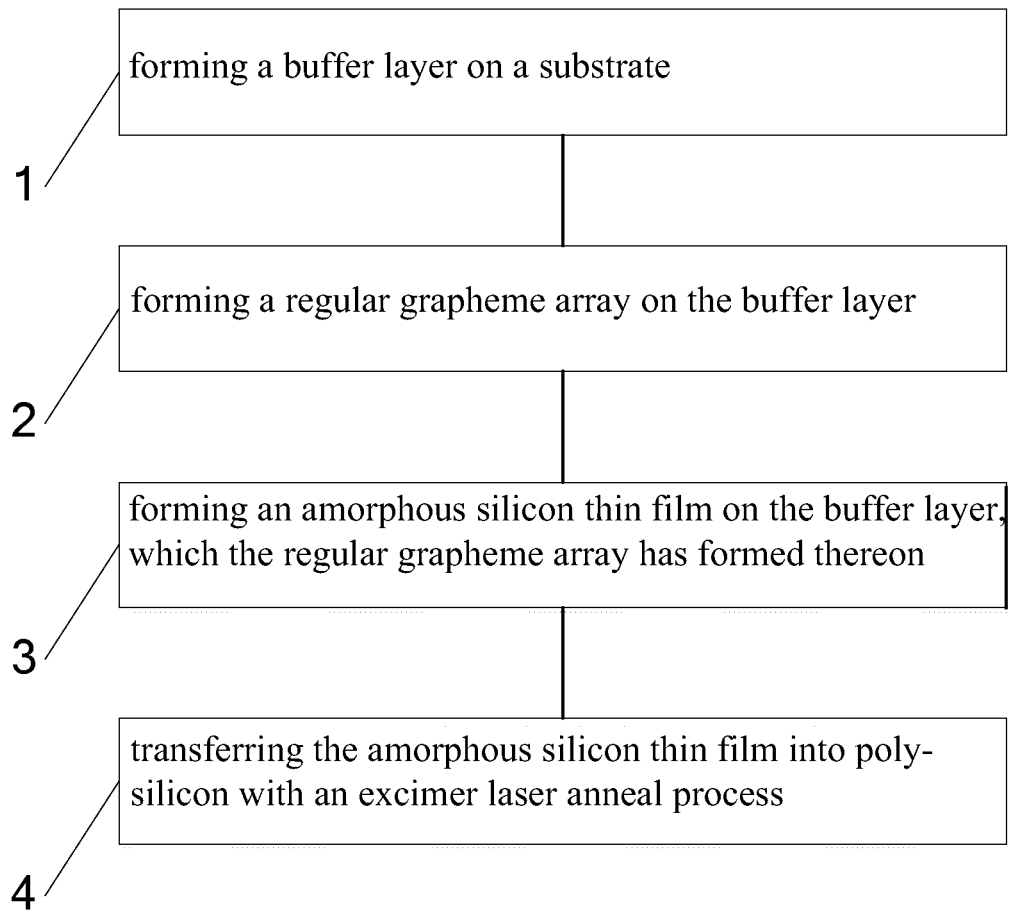
FIG. 1 is a flowchart of a method of defining poly-silicon growth direction according to the present invention.

Referring to FIG. 1, which is a flowchart of a method of defining poly-silicon growth direction according to the present invention. With a preferable embodiment of the method of defining poly-silicon growth direction according to the present invention shown in FIGS. 2-4, the method of defining poly-silicon growth direction according to the present invention comprises:

Step 1, forming a buffer layer 20 on a substrate 10; the substrate can be glass or other proper transparent material.

Step 2, forming a regular graphene array 30 on the buffer layer 20; a material of the buffer layer can be silicon nitride, silicon dioxide or other proper material.

Figure 2:
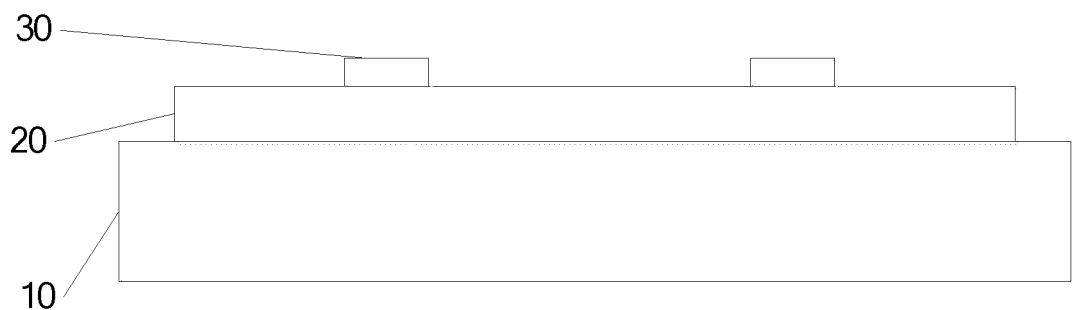
FIG. 2 is a sectional view diagram of a graphene array formed according to the method of defining poly-silicon growth direction of the present invention.

Referring to FIG. 2, which is a sectional view diagram of a graphene array formed according to the method of defining poly-silicon growth direction of the present invention. The buffer layer 20 is grown on the substrate 10. Then, the regular graphene array 30 is formed on the buffer layer 20. The buffer layer 20 can be formed by a chemical vapor deposition process or other proper manufacture processes.

Step 2 can comprises:

Step 2.1, forming a patterned masklayer on the buffer layer 20 according the required graphene array 30;

Step 2.2, forming the graphene array 30 by a chemical vapor deposition process; and Step 2.3, removing the masklayer The graphene array 30 also can be formed by other manufacture processes.

Then, Step 3 is performed, which an amorphous silicon thin film 40 is formed on the buffer layer, which the regular graphene array 30 has formed thereon.

Step 4 is performed, which the amorphous silicon thin film 40 is transferred into poly-silicon with an excimer laser anneal process.

Figure 3:
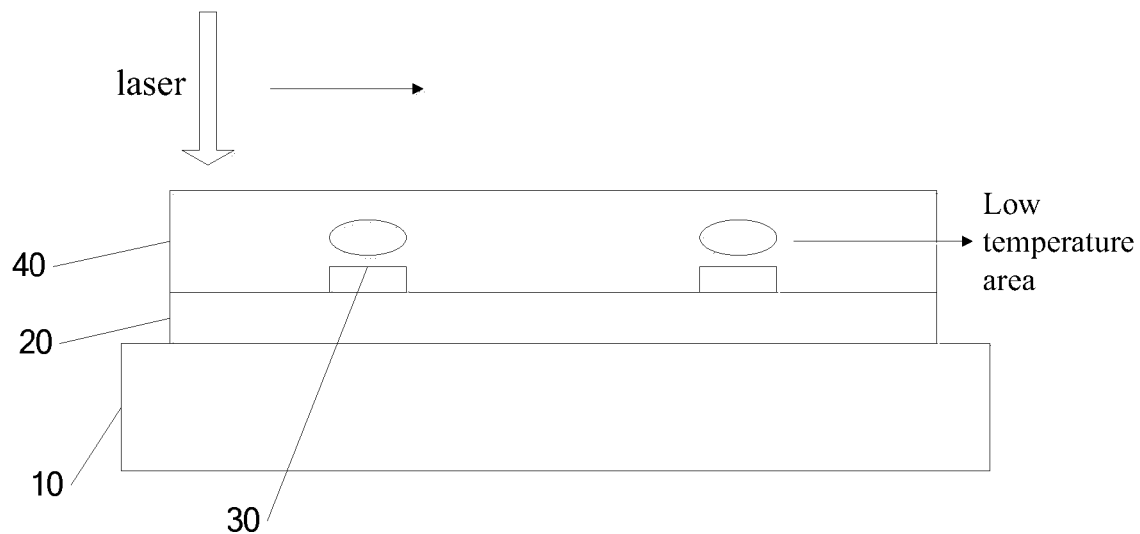
FIG. 3 is a sectional view diagram of an amorphous silicon thin film in the excimer laser anneal process according to the method of defining poly-silicon growth direction of the present invention.

Referring to FIG. 3, which is a sectional view diagram of an amorphous silicon thin film in the excimer laser anneal process according to the method of defining poly-silicon growth direction of the present invention. The amorphous silicon thin film 40 can be formed by a chemical vapor deposition process or other proper manufacture processes. In Step 4, the amorphous silicon thin film 40 can be treated by a high temperature dehydrogenation process before the excimer laser anneal process.

Figure 4:
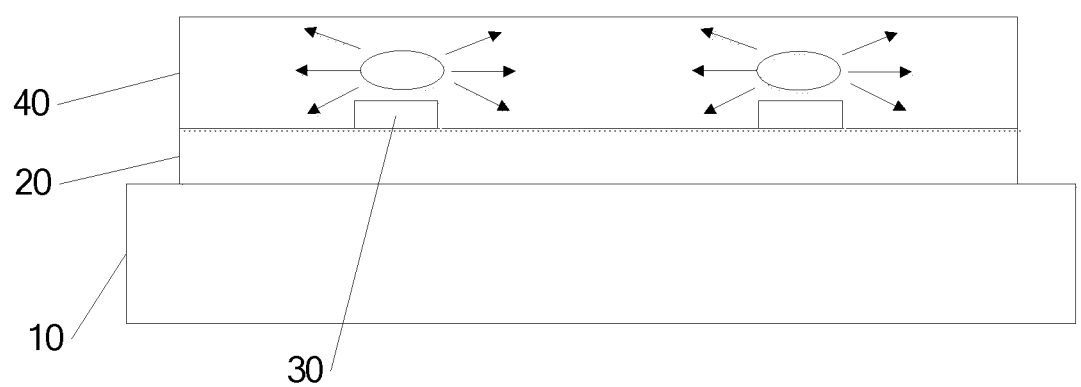
FIG. 4 is a sectional view diagram of controlling poly-silicon growth direction of the amorphous silicon thin film according to the method of defining poly-silicon growth direction of the present invention.

Referring to FIG. 4, which is a sectional view diagram of controlling poly-silicon growth direction of the amorphous silicon thin film according to the method of defining poly-silicon growth direction of the present invention.

In the excimer laser anneal process, the amorphous silicon thin film 40 absorbs the energy of the laser and the temperature of the film 40 raises because the graphene possess excellent thermal conductivity and great heat-resistance. A temperature difference is occurred to the amorphous silicon thin film 40. The temperature of the amorphous silicon in the area corresponding to the graphene array 30 is relatively lower than the temperature of the amorphous silicon in the area with no graphene array 30. Then, a low temperature area as shown in FIG. 3 is formed. As shown in FIG. 4, the poly-silicon starts growing and becomes larger from the low temperature area toward the high temperature areas around when the poly-silicon is formed. Accordingly, the objective of controlling the growth direction of the poly-silicon can be realized. Accordingly, the grain size of the poly-silicon can be raised.

By employing the method of the present invention, the distribution of the graphene array 30 on the surface of the buffer layer 20 is preset according to poly-silicon growth direction to be defined before starting to grow the poly-silicon. For example, the graphene array 30 can be preset with the same appearance and uniformly distributed on the surface of the buffer layer 20. Namely, by changing conditions of appearance and position of the graphene array 30, the poly-silicon growth direction as being formed can possibly be changed.

Moreover, an insulation layer can be formed between the substrate 10 and the buffer layer 20. A material of the insulation layer is aluminum nitride, boron nitride, aluminum oxide, magnesium oxide or other proper materials. The insulation layer can be formed by a magnetron sputtering process, a chemical vapor deposition process, or other proper manufacture processes. Besides, the method of defining poly-silicon growth direction according to the present invention can be applied for manufactures of thin film transistors, array substrates, flat panel displays and etc.

In conclusion, the growth direction of the poly-silicon as being formed can be controlled according to the present method of defining poly-silicon growth direction. Accordingly, the grain size of the poly-silicon can be raised.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A method of defining poly-silicon growth direction, comprising:
   Step 1, forming a buffer layer on a substrate;
   Step 2, forming a regular graphene array on the buffer layer;
   Step 3, forming an amorphous silicon thin film on the buffer layer, which the regular graphene array has formed thereon; and
   Step 4, transferring the amorphous silicon thin film into poly-silicon with an excimer laser anneal process.

2. The method of defining poly-silicon growth direction as claimed in claim 1, wherein Step 2 further comprises:
   Step 2.1, forming a patterned masklayer on the buffer layer according to the graphene regular graphene array;
   Step 2.2, forming the regular graphene array by a chemical vapor deposition process; and
   Step 2.3, removing the masklayer.

3. The method of defining poly-silicon growth direction as claimed in claim 1, wherein the amorphous silicon thin film is treated by a high temperature dehydrogenation process before the excimer laser anneal process in Step 4 is performed.

4. The method of defining poly-silicon growth direction as claimed in claim 1, wherein a material of the buffer layer is silicon nitride or silicon dioxide.

5. The method of defining poly-silicon growth direction as claimed in claim 1, wherein the substrate is glass.

6. The method of defining poly-silicon growth direction as claimed in claim 1, wherein distribution of the regular graphene array on the surface of the buffer layer is preset according to poly-silicon growth direction to be defined in Step 4.

7. The method of defining poly-silicon growth direction as claimed in claim 1, wherein the buffer layer and the amorphous silicon thin film are respectively formed by a chemical vapor deposition process.

8. The method of defining poly-silicon growth direction as claimed in claim 1, wherein an insulation layer is further formed between the substrate and the buffer layer.

9. The method of defining poly-silicon growth direction as claimed in claim 8, wherein a material of the insulation layer is aluminum nitride, boron nitride, aluminum oxide or magnesium oxide.

10. The method of defining poly-silicon growth direction as claimed in claim 8, wherein the insulation layer is formed by a magnetron sputtering processor a chemical vapor deposition process.

11. A method of defining poly-silicon growth direction, comprising:
    Step 1, forming a buffer layer on a substrate;
    Step 2, forming a regular graphene array on the buffer layer;
    Step 3, forming an amorphous silicon thin film on the buffer layer, which the regular graphene array has formed thereon; and
    Step 4, transferring the amorphous silicon thin film into poly-silicon with an excimer laser anneal process,
    wherein Step 2 further comprises:
    Step 2.1, forming a patterned masklayer on the buffer layer according to the graphene regular graphene array;
    Step 2.2, forming the regular graphene array by a chemical vapor deposition process; and
    Step 2.3, removing the masklayer; and
    wherein before the excimer laser anneal process in Step 4 is performed, amorphous silicon thin film is treated by a high temperature dehydrogenation process, and a material of the buffer layer is silicon nitride or silicon dioxide, and the substrate is glass, and
    wherein distribution of the regular graphene array on the surface of the buffer layer is preset according to poly-silicon growth direction to be defined in Step 4.

12. The method of defining poly-silicon growth direction as claimed in claim 11, wherein the buffer layer and the amorphous silicon thin film are respectively formed by a chemical vapor deposition process.

13. The method of defining poly-silicon growth direction as claimed in claim 11, wherein an insulation layer is further formed between the substrate and the buffer layer.

14. The method of defining poly-silicon growth direction as claimed in claim 13, wherein a material of the insulation layer is aluminum nitride, boron nitride, aluminum oxide or magnesium oxide.

15. The method of defining poly-silicon growth direction as claimed in claim 13, wherein the insulation layer is formed by a magnetron sputtering process or a chemical vapor deposition process.

* * * * *